(12) United States Patent
Park et al.

(10) Patent No.: US 10,049,883 B2
(45) Date of Patent: Aug. 14, 2018

(54) MRAM DRY ETCHING RESIDUE REMOVAL COMPOSITION, METHOD OF PRODUCING MAGNETORESISTIVE RANDOM ACCESS MEMORY, AND COBALT REMOVAL COMPOSITION

(71) Applicant: FUJIFILM CORPORATION, Minato-ku, Tokyo (JP)

(72) Inventors: Keeyoung Park, Shizuoka (JP); Atsushi Mizutani, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 0 days.

(21) Appl. No.: 15/497,224

(22) Filed: Apr. 26, 2017

(65) Prior Publication Data
US 2017/0229308 A1    Aug. 10, 2017

Related U.S. Application Data

(63) Continuation of application No. PCT/JP2015/080366, filed on Oct. 28, 2015.

(30) Foreign Application Priority Data

Oct. 31, 2014    (JP) .................. 2014-222539

(51) Int. Cl.
*H01L 21/304* (2006.01)
*C11D 17/08* (2006.01)
(Continued)

(52) U.S. Cl.
CPC ............. *H01L 21/304* (2013.01); *C11D 3/04* (2013.01); *C11D 3/26* (2013.01); *C11D 3/30* (2013.01);
(Continued)

(58) Field of Classification Search
CPC ... H01L 21/304; H01L 21/027; H01L 27/105; H01L 43/12; C11D 3/04; C11D 3/26; C11D 3/30; C11D 17/08
See application file for complete search history.

(56) References Cited

U.S. PATENT DOCUMENTS 5,714,407 A * 2/1998 Maeno .................. C09K 13/08
 252/79.2
2004/0043620 A1    3/2004 Ying et al.
(Continued)

FOREIGN PATENT DOCUMENTS

JP    2009-231354 A    10/2009
JP    2012-119564 A    6/2012
(Continued)

OTHER PUBLICATIONS

NIH, U.S. National Library of Medicine, Orthoperiodic acid.*
(Continued)

*Primary Examiner* — Duy Vu N Deo
(74) *Attorney, Agent, or Firm* — Solaris Intellectual Property Group, PLLC

(57) ABSTRACT

An object is to provide an MRAM dry etching residue removal composition capable of removing dry etching residues while suppressing damage to a substrate containing a specific metal in a step of producing an MRAM, a method of producing a magnetoresistive random access memory using the same, and a cobalt removal composition having excellent cobalt removability. The MRAM dry etching residue removal composition of the present invention contains a strong oxidizing agent and water. In addition, the cobalt removal composition of the present invention contains orthoperiodic acid and water.

10 Claims, 2 Drawing Sheets

(51) Int. Cl.
*C11D 3/04* (2006.01)
*C11D 3/26* (2006.01)
*C11D 3/30* (2006.01)
*H01L 21/027* (2006.01)
*H01L 43/12* (2006.01)
*H01L 27/105* (2006.01)
*B41N 3/08* (2006.01)
*G03F 7/40* (2006.01)

(52) U.S. Cl.
CPC ............ *C11D 17/08* (2013.01); *H01L 21/027* (2013.01); *H01L 27/105* (2013.01); *H01L 43/12* (2013.01); *B41N 3/08* (2013.01); *G03F 7/40* (2013.01)

(56) References Cited

U.S. PATENT DOCUMENTS

| | | | | |
|---|---|---|---|---|
| 2008/0026583 | A1* | 1/2008 | Hardy | B24B 37/044 438/693 |
| 2012/0139019 | A1* | 6/2012 | Iba | H01L 27/228 257/295 |
| 2013/0303420 | A1* | 11/2013 | Cooper | C11D 3/046 510/175 |
| 2015/0104952 | A1* | 4/2015 | Cui | H01L 21/02063 438/745 |

FOREIGN PATENT DOCUMENTS

| | | |
|---|---|---|
| KR | 10-2013-0049500 A | 5/2013 |
| KR | 10-2013-0049502 A | 5/2013 |

OTHER PUBLICATIONS

International Search Report issued in International Application No. PCT/JP2015/080366 dated Jan. 12, 2016.
Written Opinion of the ISA issued in International Application No. PCT/JP2015/080366 dated Jan. 12, 2016.
English language translation of the following: Office action dated Apr. 17, 2018 from the JPO in a Japanese patent application No. 2016-556595 corresponding to the instant patent application. This office action translation is submitted now in order to supplement the understanding of the cited reference which is being disclosed in the instant Information Disclosure Statement.

* cited by examiner

MRAM DRY ETCHING RESIDUE REMOVAL COMPOSITION, METHOD OF PRODUCING MAGNETORESISTIVE RANDOM ACCESS MEMORY, AND COBALT REMOVAL COMPOSITION

CROSS-REFERENCE TO RELATED APPLICATIONS

This application is a Continuation of International Application No. PCT/JP2015/080366 filed on Oct. 28, 2015, which claims priority to Japanese Patent Application No. 2014-222539 filed on Oct. 31, 2014. The entire contents of these applications are incorporated herein by reference.

BACKGROUND OF THE INVENTION

1. Field of the Invention

The present invention relates to an MRAM dry etching residue removal composition, a method of producing a magnetoresistive random access memory, and a cobalt removal composition.

2. Description of the Related Art

Processing of a semiconductor substrate includes various multistage processing steps. In the production process, a process of patterning a semiconductor layer, an electrode, and the like by dry etching is important. In the dry etching, an object to be treated is processed by generating plasma (discharge) in the inside of a device chamber and using ions or radicals generated in the inside thereof.

On the other hand, there are many cases in which the object to be treated is not completely removed in the dry etching and residues thereof usually remain on the substrate after processing. In addition, in ashing performed when a resist or the like is removed, residues similarly remain on the substrate. It is required to effectively remove these residues without damaging the processed substrate. In KR10-2013-0049500A and KR10-2013-0049502A, liquids for removing such residues are disclosed.

As the size of the wiring and integrated circuit of a semiconductor substrate becomes smaller, the importance of accurately performing residue removal without corroding a member to be left becomes higher.

SUMMARY OF THE INVENTION

The material constituting a semiconductor substrate during processing and residues remaining by dry etching or the like usually have common constitutional elements. Accordingly, it is not easy to accurately remove only the residues thereof without damaging the semiconductor substrate.

An object of the present invention is to provide an MRAM dry etching residue removal composition capable of removing dry etching residues while suppressing damage to a substrate containing a specific metal in a step of producing a magnetoresistive random access memory (MRAM), and a method of producing a magnetoresistive random access memory using the same. Another object of the present invention is to provide a cobalt removal composition having excellent cobalt removability.

The above-mentioned problems of the present invention have been solved by the following means of <1>, <10>, and <14>. <2> to <9>, <11> to <13>, and <15> to <20>, which are preferable embodiments, are also described below.

<1> An MRAM dry etching residue removal composition including: a strong oxidizing agent; and water.

<2> The MRAM dry etching residue removal composition according to <1>, in which the strong oxidizing agent is selected from the group consisting of orthoperiodic acid, cerium ammonium nitrate, sodium hypochlorite, sodium persulfate, hydroxylamine, nitric acid, hydrochloric acid, sodium chlorate, iodic acid, bromic acid, and sodium bromate.

<3> The MRAM dry etching residue removal composition according to <1> or <2>, in which the strong oxidizing agent is orthoperiodic acid.

<4> The MRAM dry etching residue removal composition according to any one of <1> to <3>, in which the content of the strong oxidizing agent is 0.01% to 5% by mass with respect to the total amount of the composition.

<5> The MRAM dry etching residue removal composition according to any one of <1> to <4>, in which the pH is 9 or more.

<6> The MRAM dry etching residue removal composition according to any one of <1> to <5>, further including: a pH adjusting agent.

<7> The MRAM dry etching residue removal composition according to <6>, in which the pH adjusting agent is selected from the group consisting of an organic amine compound and a quaternary ammonium hydroxide.

<8> The MRAM dry etching residue removal composition according to <6> or <7>, in which the content of the pH adjusting agent is 0.01% to 5% by mass with respect to the total amount of the composition.

<9> The MRAM dry etching residue removal composition according to any one of <1> to <8>, in which the content of water is 30% by mass or more with respect to the total amount of the composition.

<10> A method of producing a magnetoresistive random access memory including: a step of dry etching a semiconductor substrate including a ferromagnetic layer containing CoFeB and/or CoFe and an insulator layer containing MgO; and a step of removing dry etching residues with the MRAM dry etching residue removal composition according to any one of <1> to <9>.

<11> The method of producing a magnetoresistive random access memory according to <10>, in which the dissolution rate of Co of the MRAM dry etching residue removal composition is 0.2 nm/min or greater.

<12> The method of producing a magnetoresistive random access memory according to <10> or <11>, in which in a case in which the dissolution rate of CoFeB of the MRAM dry etching residue removal composition is 0 nm/min or the dissolution rate of CoFeB of the MRAM dry etching residue removal composition is greater than 0 nm/min, a ratio between the dissolution rate of Co and the dissolution rate of CoFeB (Co dissolution rate/CoFeB dissolution rate) is 10 or greater.

<13> The method of producing a magnetoresistive random access memory according to any one of <10> to <12>, in which the dissolution rate of MgO of the MRAM dry etching residue removal composition is 1 nm/min or less.

<14> A cobalt removal composition including: orthoperiodic acid; and water.

<15> The cobalt removal composition according to <14>, in which the content of orthoperiodic acid is 0.01% to 5% by mass with respect to the total amount of the composition.

<16> The cobalt removal composition according to <14> or <15>, in which the pH is 9 or more.

<17> The cobalt removal composition according to any one of <14> to <16>, further including: a pH adjusting agent.

<18> The cobalt removal composition according to <17>, in which the pH adjusting agent is selected from the group consisting of an organic amine compound and a quaternary ammonium hydroxide.

<19> The cobalt removal composition according to <17> or <18>, in which the content of the pH adjusting agent is 0.01% to 5% by mass with respect to the total amount of the composition.

<20> The cobalt removal composition according to any one of <14> to <19>, in which the content of water is 30% by mass or more with respect to the total amount of the composition.

According to the present invention, it is possible to provide an MRAM dry etching residue removal composition capable of removing dry etching residues while suppressing damage to a substrate containing a specific metal in a step of producing an MRAM, and a method of producing a magnetoresistive random access memory using the same. According to the present invention, it is also possible to provide a cobalt removal composition having excellent cobalt removability.

DESCRIPTION OF THE PREFERRED EMBODIMENTS

Incidentally, the term "group (a group of atoms)" used herein is intended to include both unsubstituted and substituted ones unless designated as "unsubstituted" or "substituted". For example, the term "alkyl group" used herein includes not only an alkyl group having no substituent (an unsubstituted alkyl group) but also an alkyl group having a substituent (a substituted alkyl group).

In addition, each component in the composition of the specification can be used alone or in combination of two or more thereof.

In the present invention, "part(s) by mass" and "% by mass" have the same meaning as "part(s) by weight" and "% by weight", respectively. Note that the expression of all numerical ranges using "to" in the specification mean the range covering the values before and after "to" as the lower and upper limits, respectively.

Further, in the following description, a combination of preferable embodiments is a more preferable embodiment.

1. MRAM Dry Etching Residue Removal Composition and Method of Producing Magnetoresistive Random Access Memory Regarding an etching residue removal composition according to the present invention and a method of removing etching residues using the same, processing of MRAM, which is a preferable embodiment thereof, will be described as an example. However, the present invention is not interpreted as being limited to this embodiment.

(Dry Etching Residue Removal Step)

Figure 1:
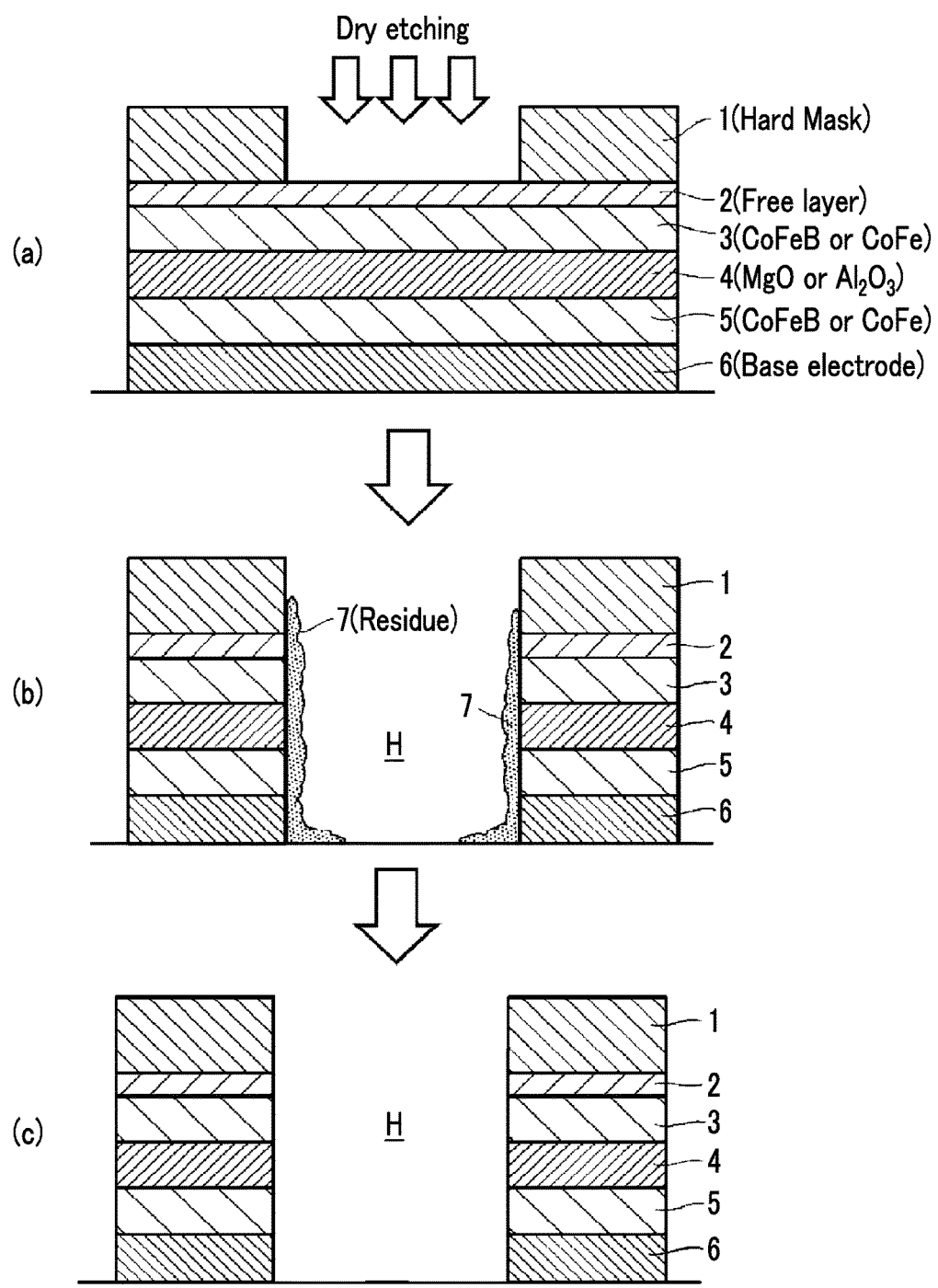
FIG. 1 is a cross-sectional view schematically showing an example of a step of producing a semiconductor substrate according to an embodiment of the present invention.

FIG. 1($a$) is a view showing a semiconductor substrate before dry etching is performed. As the lamination structure of MRAM of the embodiment is described from the lower layer, the MRAM includes a base electrode 6, a first ferromagnetic layer 5, an insulator layer 4, a second ferromagnetic layer 3, and a free layer 2. In the processing step of this stage, a pattern is formed by a hard mask 1 for the following dry etching. The material for the hard mask 1 is not particularly limited and an arbitrary material can be appropriately selected and employed. Although not shown in the drawing, a silicon wafer is present below the shown laminate. The material for the silicon wafer is not particularly limited and a substrate constituted of Si, $SiO_2$, or the like can be appropriately employed. A commercially available silicon wafer may be also used.

The material for the base electrode 6 is not particularly limited and common electrode materials such as copper, aluminum, and titanium nitride (TiN) can be used.

The materials for constituting the first ferromagnetic layer 5 and the second ferromagnetic layer 3 are not particularly limited and Fe, CoFe, CoFeB, and the like may be used.

Examples of the material for the insulator layer 4 include aluminum oxide ($AlO_x$) and magnesium oxide ($MgO_x$).

Examples of the material for the free layer 2 include permalloy (Py) (Fe—Ni alloy), and Co—Fe alloy.

The materials for these layers can be used by appropriately selecting each material to be applied to MRAM. The method of forming each layer is not particularly limited and each layer can be appropriately formed by molecular beam epitaxy method (MBE) or the like.

MRAM is a memory using a ferromagnetic tunnel junction (MTJ) having a basic structure of ferromagnetic body/insulator/ferromagnetic body. The operation principle thereof is roughly classified into operation principle using giant magnetoresistance effect (abbreviated as GMR effect), operation principle using tunnel magnetoresistance effect (abbreviated as TMR effect), and operation principle using colossal magnetoresistance effect (CMR). The example of FIG. 1 is an element using TMR effect but the present invention is not limited to this example.

In the case of constituting a device using the element, MTJ is disposed at an intersection of a bit line and a write word line arranged in a matrix shape. When a current is applied to the bit line and the write word line, the synthetic magnetic field of magnetic fields induced from the respective conducting wires is applied to the intersection. When the magnetic field generated from only the bit line or write word line does not exceed the magnetic field required for reversing the free layer (switching magnetic field) and the synthetic magnetic field is designed to exceed the switching magnetic field, it is possible to control writing to only the cell present at the intersection of the both conducting wires. When magnetization reversal is caused by simultaneous rotation, the magnetic field required for the reversal is expressed as an asteroid curve.

Examples of the structure of the MTJ element of MRAM which has been proposed so far include CCFA/$AlO_x$/CoFe, Fe/MgO/Fe, CoFe/MgO/CoFe, and CoFeB/MgO/CoFeB using $(Co_{75}Fe_{25})_{80}B_{20}$/AlOx/CoFe/Ru/CoFe/PtMn, Fe/MgO/Fe, $Co_2MnAl/AlO_x$/CoFe, and $Co_2(Cr_{1-x}Fe_x)Al$ (CCFA).

For the details of the technologies related to such MRAM, "MRAM/spin memory technology", JP2014-22730A, "Standards and Technology Collection (MRAM and spin memory)" posted on the Japanese Patent Office home page, http://www.jpo.go.jp/shiryou/s_sonota/hyoujun_gijutsu/mram/mokuji.htm (the contents published on May 3, 2014), and the like can be referred to.

As described above, in the MTJ element of MRAM, a metal compound containing Co (hereinafter, also referred to a cobalt alloy or Co alloy) is frequently used as a ferromagnetic body.

FIG. 1(b) shows a state after the laminate in FIG. 1(a) above is subjected to a dry etching treatment. In this state, a portion of the substrate material on which the hard mask 1 is not provided is removed and thus a hole H is formed in the portion. The method for dry etching is not particularly limited and a common method may be used. For example, dry etching can be performed by a dry etching method using a mixed gas having a mixed ratio of a fluorine-based gas and $O_2$ (fluorine-based gas/$O_2$) of 4/1 to 1/5 in terms of flow ratio (the ratio between a fluorine-based gas and oxygen varies depending on the C content of the fluorine-based gas). As representative examples of the dry etching method, methods described in JP1984-126506A (JP-S59-126506A), JP1984-46628A (JP-S59-46628A), JP1983-9108A (JP-S58-9108A), JP1983-2809A (JP-S58-2809A), JP1982-148706A (JP-S57-148706A), and JP1986-41102A (JP-S61-41102A) are known.

Simultaneously, in this step, residues 7 remain in the formed hole H. When the next step proceeds in a state in which the residues remain, conduction failure, material deterioration, and the like may be caused in the portion in which the residues remain when an element is formed. Thus, it is preferable that the residues are removed completely as much as possible. In this step, the hard mask 1 may be etched to a considerable degree.

A preferable example of the conditions for the dry etching is as follows.

Figure 2:
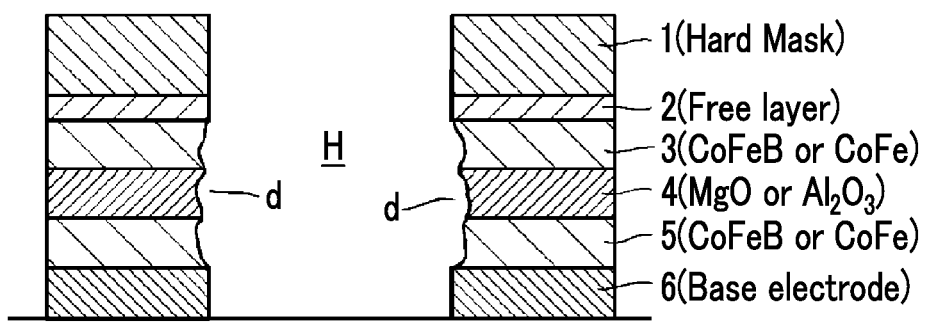
FIG. 2 is a cross-sectional view schematically showing a semiconductor substrate (comparative example) damaged by a residue removal treatment.

Treatment Parameter
Pressure: 0.5 to 5 Pa
Used gas: Ar/$C_4F_6$ (hexafluoro-1,3-butadiene)/$O_2$=500 to 1,000/5 to 50/20 to 100 mL/min
Treatment temperature: 5° C. to 50° C.
Source power: 100 to 1,000 W
Upper bias/Electrode bias=100 to 1,000/100 to 1,000 W
Treatment time: 50 to 1,000 sec FIG. 1(c) shows an embodiment example of the semiconductor substrate after the residues are removed. In the present invention, as shown in the drawing, it is preferable that the material constituting each layer of the substrate is maintained at a good state after etching without being damaged or corroded. FIG. 2 shows a comparative example for comparison with the above example. In this example, the ferromagnetic layers 3 and 5 and the insulator layer 4 in the semiconductor substrate are under corrosion and thus a damaged portion d in which the material is chipped off in the horizontal direction is formed. It is preferable that the treatment is performed not to cause such damage if it is possible by suppressing the damage as much as possible. However, it should not be interpreted that the present invention is not limited to the example and comparative example shown in the above drawings.

Incidentally, in the example shown in the drawing, the hard mask 1 remains even after the residues are removed. However, the hard mask 1 may be removed at the same time by the residue removal treatment.

Although the thickness of each layer is not particularly limited, the thickness of the ferromagnetic layer is preferably 5 nm or more and 20 nm or less from the viewpoint the effects of the present invention become remarkable. The thickness of the insulator layer is preferably 10 nm or more and 20 nm or less from the viewpoint that the effects of the present invention become remarkable. The thickness of the free layer is preferably 10 nm or more and 20 nm or less from the viewpoint of the function of an element. The thickness of the base electrode is preferably 10 nm or more and 20 nm or less from the viewpoint of the function of an element. The thickness of the hard mask is preferably 10 nm or more and 20 nm or less from the viewpoint of suitability of etching. The thickness of each layer and the dimensions of the members in the semiconductor substrate are evaluated based on an average value at arbitrarily ten points observed with a transmission type electron microscope (TEM) unless otherwise specified.

(MRAM Dry Etching Residue Removal Composition)

An MRAM dry etching residue removal composition of the present invention (hereinafter, also simply referred to as an "etching residue removal composition" or "removal composition") contains a strong oxidizing agent and water. Hereinafter, each component including other components will be described.

The MRAM dry etching residue removal composition of the present invention is sold, stored, transported and the like in a condensed state, and may be diluted to be used in use. Such an embodiment is included in the etching residue removal composition of the present invention. In the following description, the content and pH of each component in the MRAM dry etching residue removal composition mean the content and pH of each component in use and also include an embodiment in which in the case of selling, storing, transporting, and the like of the composition, the content and pH of each component are set to be within the following ranges by diluting the composition to be used in use.

<Strong Oxidizing Agent>

The MRAM dry etching residue removal composition of the present invention includes a strong oxidizing agent.

Examples of the strong oxidizing agent include orthoperiodic acid ($H_5IO_6$), cerium ammonium nitrate, sodium hypochlorite, sodium persulfate, hydroxylamine, nitric acid, hydrochloric acid, sodium chlorate, iodic acid, bromic acid, and sodium bromate.

Among these, as the strong oxidizing agent, orthoperiodic acid, cerium ammonium nitrate, sodium hypochlorite, and sodium persulfate are preferable, orthoperiodic acid and cerium ammonium nitrate are more preferable, and orthoperiodic acid is even more preferable.

The content of the strong oxidizing agent in the etching residue removal composition is preferably 0.01% to 5% by mass with respect to the total amount of the composition. The content is more preferably 0.05% by mass or more, even more preferably 0.1% by mass or more, and particularly preferably 0.3% by mass or more. In addition, the content is more preferably 4% by mass or less and even more preferably 3% by mass or less.

When the content of the strong oxidizing agent is within the above range, the etching residue removal composition is excellent in removability of MRAM dry etching residues and the ferromagnetic bodies and the insulating layer constituting the substrate are prevented from being damaged.

The strong oxidizing agent may be used alone or in combination of two or more thereof. In the case of using two or more of strong oxidizing agents in combination, the total content is preferably within the above range.

It is interpreted that the strong oxidizing agent exhibits an action of dissolving a metal component (metal) in the system. It is difficult to predict a chemical state of residues of the element of each layer by the dry etching step. Accordingly, it is difficult to specify how the MRAM dry etching residue removal composition of the present invention and the strong oxidizing agent contained in the composition act on which metal component. However, in the embodiment, it is interpreted that effective removal of residues and protection of each layer of the substrate (particularly, the ferromagnetic layers and the insulator layer), which is typically contrary to the removal, can be realized by imparting the removability of the above metal component (metal) by the strong oxidizing agent.

As a result of intensive investigations of the present inventors, it has been found that in the case of using a cobalt alloy for the ferromagnetic layer, metal cobalt is contained in the dry etching residues. In the MRAM dry etching residue removal composition of the present invention, particularly, the dissolution rate of cobalt (metal cobalt) included in the residues is high, the removability of cobalt is excellent, the dissolution rate of the cobalt alloy included in the ferromagnetic layer, which is typified by CoFeB, is low, and damage to the substrate is suppressed.

<Water>

The MRAM dry etching residue removal composition of the present invention contains water. As water, water, which is subjected to a purification treatment, such as distilled water and ion exchange water or ultrapure water, is preferable and ultrapure water to be used for producing a semiconductor is particularly preferable.

Water may contain a small amount of unavoidable mixing components within a range not impairing the effects of the present invention.

Although the content of water is not particularly limited, the content is preferably 30% by mass or more, more preferably 50% by mass or more, even more preferably 70% by mass or more, and particularly preferably 90% by mass or more with respect to the total amount of the composition. The upper limit is not particularly limited and is preferably the total amount excluding the aforementioned strong oxidizing agent and a pH adjusting agent, as a preferable additive, which will be described later.

When the content of water is 30% by mass or more, residue removability is excellent and damage to the substrate is suppressed. Thus, this case is preferable.

<Other Solvents>

The MRAM dry etching residue removal composition of the present invention may contain a water-soluble organic solvent in addition to water.

Examples of the water-soluble organic solvent include alcohol-based solvents such as methyl alcohol, ethyl alcohol, 1-propyl alcohol, 2-propyl alcohol, ethylene glycol, propylene glycol, glycerol, 1,6-hexanediol, sorbitol, and xylitol, ether-based solvents such as ethylene glycol monomethyl ether, diethylene glycol, diethylene glycol monomethyl ether, triethylene glycol, polyethylene glycol, and propylene glycol monomethyl ether, amide-based solvents such as formamide, monomethylformamide, dimethylformamide, acetamide, monomethylacetamide, dimethyl acetamide, monoethylacetamide, diethylacetamide, and N-methylpyrrolidone, sulfur-containing solvents such as dimethylsulfone, dimethylsulfoxide, and sulfolane, and lactone-based solvents such as γ-butyrolactone and δ-valerolactone.

In the present invention, it is preferable that the water-soluble organic solvent contains a glycol compound. The glycol compound refers to a compound having the moiety represented by Formula G below in the structure. The glycol compound is preferably a compound constituted of a carbon atom, an oxygen atom, and a hydrogen atom. The number of carbon atoms in the glycol compound is preferably 2 to 32, more preferably 4 to 24, and particularly preferably 4 to 18.

$$*\text{—(O—R}^G\text{—O)—}* \tag{G}$$

In Formula G, the symbol * represents a bonding site. $R^G$ represents an alkylene group (preferably having 1 to 12 carbon atoms, more preferably having 1 to 6 carbon atoms, and particularly preferably having 1 to 3 carbon atoms).

It is preferable that the glycol compound, is at least one selected from the group consisting of ethylene glycol, diethylene glycol, triethylene glycol, tetraethylene glycol, ethylene glycol monomethyl ether, ethylene glycol monoethyl ether, ethylene glycol monobutyl ether, diethylene glycol monomethyl ether, diethylene glycol monoethyl ether, diethylene glycol monobutyl ether (2-(2-butoxyethoxy) ethanol), triethylene glycol monomethyl ether, triethylene glycol monoethyl ether, triethylene glycol monobutyl ether, and diethylene glycol dimethyl ether. Among these, alkylene glycol monoalkyl ether is more preferable and diethylene glycol monobutyl ether is particularly preferable.

The content of the water-soluble organic solvent in the MRAM dry etching residue removal composition is used at a concentration of preferably 0% to 40% by mass, more preferably 0% to 20% by mass, and particularly preferably 0% to 10% by mass with respect to the total mass of the composition.

When the content of the water-soluble organic solvent is within the above range, residue removability is excellent and damage to the substrate is suppressed.

In the present invention, one water-soluble organic solvent may be used or two or more water-soluble organic solvents may be used in combination. In the case of using two or more water-soluble organic solvents in combination, the combination ratio thereof is not particularly limited and the total amount used is preferably within the above content range as the total sum of the two or more water-soluble organic solvents.

<pH Adjusting Agent>

It is preferable that the MRAM dry etching residue removal composition of the present invention contains a pH adjusting agent. Needless to say, the pH adjusting agent is a component other than the aforementioned strong oxidizing agent and water.

Preferable examples of the pH adjusting agent include an organic amine compound and a quaternary ammonium hydroxide and a quaternary ammonium hydroxide is more preferable.

The organic amine compound and the quaternary ammonium hydroxide will be described below, respectively.

[Organic Amine Compound]

The organic amine compound is a general term for organic compounds having any of a primary amino group, a secondary amino group, and a tertiary amino group in the molecule. Further, the amine compound in the present invention includes an amine oxide compound. The organic amine compound has a carbon atom, a nitrogen atom, and a hydrogen atom as essential constituent elements and is preferably a compound including an oxygen atom as required.

As the organic amine compound, a compound represented by any of the following Formulae (P-1) to (P-5) is exemplified.

(P-1)

(P-2)

(P-3)

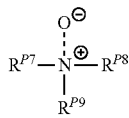
(P-4)

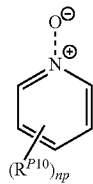
(P-5)

$R^{P1}$ to $R^{P9}$ each independently represent an alkyl group (preferably having 1 to 6 carbon atoms), an alkenyl group (preferably having 2 to 6 carbon atoms), an alkynyl group (preferably having 2 to 6 carbon atoms), an aryl group (preferably having 6 to 10 carbon atoms), a heterocyclic group (preferably having 2 to 6 carbon atoms), an aryloyl group (preferably having 7 to 15 carbon atoms), or a group represented by the following Formula x.

Among these, $R^{P1}$ to $R^{P9}$ are preferably each independently an alkyl group, an alkenyl group, an aryl group, or a group represented by the following Formula x, and particularly preferably an alkyl group or a group represented by the following Formula x.

These groups may further have a substituent group T.

Examples of the substituent T include a halogen atom, an alkyl group, an alkenyl group, an alkynyl group, an aryl group, a heterocyclic group, an acyl group, an aryloyl group, an alkoxy carbonyl group, an alkoxy carbonyl amino group, a hydroxy group (OH), carboxyl group (COOH), a sulfanyl group (SH), an alkoxy group, an aryloxy group, an alkyl sulfanyl group, and an aryl sulfanyl group.

Among these, the substituent group T is preferably a hydroxy group (OH), a carboxyl group (COOH), a sulfanyl group (SH), an alkoxy group, or an alkyl sulfanyl group as an arbitrary substituent to be added. In addition, each of an alkyl group, an alkenyl group, and an alkynyl group may include 1 to 4 O's, S's, CO's, and $NR^N$'s ($R^N$ represents a hydrogen atom or an alkyl group having 1 to 6 carbon atoms), respectively.

X1-(Rx1-X2)mx-Rx2-*     (x)

X1 represents a hydroxy group, a sulfanyl group, an alkoxy group having 1 to 4 carbon atoms, or an alkyl sulfanyl group having 1 to 4 carbon atoms. Among these, a hydroxy group is preferable.

Rx1 and Rx2 each independently represent an alkylene group having 1 to 6 carbon atoms, an alkenylene group having 2 to 6 carbon atoms, an alkynylene group having 2 to 6 carbon atoms, an arylene group having 6 to 10 carbon atoms, or a group obtained by combining two or more these groups. Among these, an alkylene group having 1 to 6 carbon atoms is preferable.

X2 represents O, S, CO or $NR^N$. Among these, O is preferable.

mx represents an integer of 0 to 6. When mx is 2 or greater, a plurality of Rx1's and X2's are may be the same or different from each other. Rx1 and Rx2 may further have a substituent T.

The symbol "*" indicates a bonding position to a nitrogen atom in the Formulae P-1 to P-4.

$R^{P10}$ has the same meaning as the above substituent T. np is an integer of 0 to 5.

As the amine compound, a compound selected from the group consisting of monoethanolamine, diglycolamine (aminoethoxy ethanol), monoisopropanolamine, isobutanolamine, linear alkanolamine having 2 to 8 carbon atoms, methylethanolamine, N-methylaminoethanol, diethanolamine, triethanolamine, methyl diethanolamine, triethylamine, pentamethyldiethylenetriamine, N-methylmorpholine-N-oxide (NMMO), trimethylamine-N-oxide, triethylamine-N-oxide, pyridine-N-oxide, N-ethylmorpholine-N-oxide, N-methylpyrrolidine-N-oxide, N-ethylpyrrolidine-N-oxide, substituted derivatives thereof, and a combination thereof is preferable. Among these, alkanolamine is preferable and monoethanolamine or diglycolamine is particularly preferable. The substituent derivative is a general term for compounds having a substituent (for example, the aforementioned substituent group T) in each compound.

[Quaternary Ammonium Hydroxide]

As the quaternary ammonium hydroxide, a tetraalkylammonium hydroxide is preferable, and a tetraalkylammonium hydroxide substituted with a lower (having 1 to 4 carbon atoms) alkyl group is more preferable. Specific examples of the tetraalkylammonium hydroxide include tetramethylammonium hydroxide (TMAH), tetraethyl ammonium hydroxide (TEAH), tetrapropylammonium hydroxide (TPAH), tetrabutylammonium hydroxide (TBAH), methyltripropylammonium hydroxide, and cetyltrimethylammonium hydroxide.

Examples of the quaternary ammonium hydroxide further include trimethyl(2-hydroxyethyl)ammonium hydroxide (choline), methyltri(2-hydroxyethyl)ammonium hydroxide, tetra(2-hydroxyethyl)ammonium hydroxide, and benzyltrimethylammonium hydroxide (BTMAH).

Among these, as the quaternary ammonium hydroxide, TMAH, TEAH, TPAH, TBAH, and choline are preferable and TMAH, TEAH, and TBAH are more preferable.

The content of the pH adjusting agent may be appropriately selected so as to have a desired pH to be described later and is not particularly limited. The content is preferably 0.005% by mass or more, more preferably 0.01% by mass or more, and even more preferably 0.1% by mass or more in the MRAM dry etching residue removal composition. The upper limit is preferably 20% by mass or less, more preferably 10% by mass or less, even more preferably 5% by mass or less, and particularly preferably 3% by mass or less.

When the content of the pH adjusting agent is within the above range, the removability of the MRAM dry etching residue is excellent and damage to the substrate is suppressed. Thus, this case is preferable.

In comparison with the strong oxidizing agent, the content of the pH adjusting agent contained is preferably 100 parts by mass to 1,000 parts by mass, more preferably 100 to 900 parts by mass, and even more preferably 130 to 740 parts by mass with respect to the 100 parts by mass of the strong oxidizing agent.

In the present invention, the pH adjusting agent may be used alone or in combination of two or more thereof. In the case of using two or more pH adjusting agents, it is preferable that the total content thereof is within the above range.

<Other Components>

The MRAM dry etching residue removal composition of the present invention may further contain arbitrary components. For example, various surfactants described in paragraph [0026] of JP2014-093407A, paragraphs [0024] to [0027] of JP2013-055087A, paragraphs [0024] to [0027] of JP2013-012614A, and the like may be used. Alternatively, various additives (anticorrosive and the like) disclosed in paragraphs [0017] to [0038] of JP2014-107434A, paragraphs [0033] to [0047] of JP2014-103179A, paragraphs [0017] to [0049] of JP2014-093407A, and the like may be used.

However, in the present invention, a composition not including these arbitrary components is preferable and an MRAM dry etching residue removal composition constituted of a strong oxidizing agent, a pH adjusting agent, and water is particularly preferable. However, even in such a case, it is not possible to prevent unavoidable impurities from being included in the composition.

<pH>

In the present invention, it is preferable that the pH of the etching residue removal composition is in an alkali region. Specifically, the pH is preferably 9 or more and 14 or less and more preferably 10 or more and 13 or less.

When the pH is within the above range, residue removability is excellent and the surface of the film is prevented from being modified. Thus, this case is preferable.

[pH Measurement Method]

The pH is a value measured at room temperature (25° C.) using F-51 (trade name) manufactured by Horiba, Ltd.

In the specification, when a compound or a substituent, a linking group, or the like contains, an alkyl group, an alkylene group, an alkenyl group, an alkenylene group, or the like, these groups may be cyclic or chain, may be linear or branched, and may be substituted with an arbitrary group or unsubstituted. At this time, an alkyl group, an alkylene group, an alkenyl group, an alkenylene group, an alkynyl group, and an alkynylene group may include a group including a hetero atom (for example, O, S, CO, or $NR^N$) and thus a ring structure may be formed. In addition, when an aryl group, a heterocyclic group, and the like are included, these may be a single ring or a condensed ring and may be substituted or unsubstituted in the same manner.

In the specification, adjacent substituents may be linked within a range of exhibiting the effects of the present invention to form a ring. At this time, adjacent substituents may be linked to a group including a hetero atom.

In the specification, it is possible to combine each technical item such as temperature and thickness as well as the options for the substituent or the linking group of the compound even when the lists thereof are each independently described.

In the specification, when a compound is specified by being added at the end of the compound, the meaning of the compound includes a salt thereof and an ion thereof in addition to the above compound within a range of exhibiting the effects of the present invention. Further, similarly, the meaning also includes a derivative thereof.

The display of compounds in the specification (for example, when a compound is referred to by being added at the end of the compound) is used to include a salt thereof and an ion thereof in addition to the compound itself. Further, the display thereof includes a derivative which is partially changed by introducing a substituent within a range in which desired effects are exhibited.

A substituent (the same applies to a linking group) in which substitution or unsubstitution is not specified in the specification means that an arbitrary substituent may be included in the group. The same applies to a compound in which substitution or unsubstitution is not specified.

(Conditions for Residue Removal)

A residue removal treatment according to the present invention may be performed using a batch type device or may be performed using a sheet type device. The treatment temperature is preferably 10° C. or higher, more preferably 15° C. or higher, and even more preferably 20° C. or higher. The upper limit is preferably 50° C. or lower, more preferably 40° C. or lower, and even more preferably 30° C. or lower. Setting the treatment temperature to the above lower limit or higher makes it possible to secure a sufficient removing rate with respect to the residues and thus is preferable. Setting the treatment temperature to the above upper limit or lower makes it possible to maintain temporal stability in treatment rate and thus is preferable. Further, energy consumption is reduced.

It is preferable that a metal layer to be protected has a low dissolution rate (etching rate). For example, the etching rate [R1] of the ferromagnetic layer or the insulating layer (specifically, CoFe, CoFeB, MgO, $Al_2O_3$, and the like) in MRAM is preferably 1 nm (10 Å)/min or less, more preferably 0.5 nm (5 Å)/min or less, and even more preferably 0.1 nm (1 Å)/min or less. The lower limit is 0 nm/min and the lower the rate is, the more preferable it is.

Here, the dissolution rate is measured by the following method. Specifically, on a commercially available silicon wafer, substrates on which target layers (for example, a CoFeB layer and a MgO layer) are formed are respectively prepared. Regarding the thickness of each layer, the thickness of the metal layer to be protected, for example, a CoFeB layer or a MgO layer, is set to 50 nm (500 Å) and the thickness of the Co layer, which is a metal layer to be removed, is 200 nm (2,000 Å). The substrate is put into a container filled with the removal composition and is stirred at 250 rpm. The treatment temperature is set to 25° C. and the treatment time is set to 10 minutes. The test substrate after treatment is taken out and subjected to rinsing with isopropanol and the film thicknesses before and after the etching treatment are measured using ellipsometry (Vase, spectroscopic ellipsometer, manufactured by J. A. Woollam, Japan) to calculate the dissolution rate. The average value at five points is adopted (measurement conditions: measurement range: 1.2 to 2.5 eV, measuring angles: 70 degrees and 75 degrees).

Only the film thickness of the Co layer is measured using a resistivity measuring instrument VR-120S manufactured by Hitachi Kokusai Yagi Solutions Inc., by a DC four-probe method using a four point probe.

Particularly, in the present invention, it is preferable that in the MRAM dry etching residue removal composition, while the dissolution rate of cobalt (metal cobalt) is high, the dissolution rate of the cobalt alloy, which is used in the ferromagnetic layer (for example, CoFeB), is low. More specifically, the dissolution rate of cobalt is preferably 0.08 nm (0.8 Å)/min or greater, more preferably 0.2 nm (2.0 Å)/min or greater, even more preferably 0.5 nm (5.0 Å)/min or greater, and particularly preferably 1 nm (10 Å)/min or greater. In addition, the upper limit is not particularly limited and is preferably 100 nm/min or less.

Further, in the case in which the dissolution rate of the cobalt alloy, which is used for forming a ferromagnetic layer and is typified by CoFeB, is 0 nm/min or the dissolution rate of the cobalt alloy is greater than 0 nm/min, the ratio between the etching rate of Co and the dissolution rate of the cobalt alloy, which is used for forming a ferromagnetic layer and is typified by CoFeB, (Co dissolution rate/CoFeB dissolution rate) is preferably 2 or more, more preferably 5 or more, even more preferably 10 or more, particularly preferably 30 or more, and most preferably 50 or more. The upper limit is infinite without particular limitation and is preferably $10^{10}$ or less.

It is preferable that the dissolution rate of CoFeB of the MRAM dry etching residue removal composition of the present invention is low. The dissolution rate is preferably 1 nm (10 Å)/min or less, more preferably 0.5 nm (5 Å)/min or less, and even more preferably 0.1 nm (1 Å)/min or less. The lower limit is 0 nm/min.

It is preferable that the dissolution rate of MgO of the MRAM dry etching residue removal composition of the present invention is low. Specifically, the dissolution rate is preferably 2 nm (20 Å)/min or less, more preferably 1 nm (10 Å)/min or less, even more preferably 0.5 nm (5 Å)/min or less, and particularly preferably 0.1 nm (1 Å)/min or less. The lower limit is 0 nm/min.

In addition, in the case in which the dissolution rate of MgO is 0 nm/min or the dissolution rate of MgO is greater than 0 nm/min, the ratio between the etching rate of Co and the dissolution rate of MgO (Co dissolution rate/MgO dissolution rate) is preferably 2 or greater and more preferably 5 or greater. The upper limit is infinite without particular limitation and is preferably $10^{10}$ or less.

The exposure width of the metal layer (thickness of each layer) is not particularly limited and is preferably 1 nm or more and more preferably 2 nm or more from the viewpoint that the advantages of the present invention become remarkable. The upper limit is substantially 200 nm or less, preferably 100 nm or less, and more preferably 50 nm or less from the viewpoint that the effects thereof become significant in the same manner.

(Production of Magnetoresistive Random Access Memory)

In the embodiment, it is preferable that a magnetoresistive random access memory (semiconductor substrate product) having a desired structure is produced through a step of preparing a silicon wafer, a step of forming a semiconductor substrate by forming layers of each metal or metal compound described above on the silicon wafer, a step of dry etching the semiconductor substrate, and a step of removing etching residues by applying a residue removal composition to the etched semiconductor substrate. The order of the above steps is not interpreted to be limited and other steps may be further included between the respective steps.

It is more preferable that the method of producing a magnetoresistive random access memory of the present invention includes a step of dry etching a semiconductor substrate including a ferromagnetic layer containing CoFeB and/or CoFe and an insulator layer containing MgO, and a step of removing dry etching residues with the MRAM dry etching residue removal composition of the present invention.

The size of the wafer is not particularly limited, but a wafer whose diameter is 8 inches, 12 inches, or 14 inches can be preferably used (1 inch=25.4 mm).

In the specification, the meaning of "preparation" includes not only preparing a specific material by synthesizing, mixing or the like, but also supplying a predetermined substance through purchasing or the like. In addition, in the specification, the use of a composition (chemical) in the treatment for each material of the semiconductor substrate is referred to as "application" but the embodiment thereof is not particularly limited. For example, contacting the composition with the substrate is widely included and specifically, etching may be performed by immersion by a batch type device or discharge by a sheet type device.

In the specification, the meaning of a semiconductor substrate includes not only a wafer but also an entire substrate structure in which a circuit structure is provided on the wafer. A semiconductor substrate member may refer to the member constituting the semiconductor substrate defined in the above description and may be formed of a single material or a plurality of materials. The processed semiconductor substrate is sometimes referred to as a semiconductor substrate product for distinction and a chip or a processed product thereof obtained by applying processing to the processed semiconductor substrate and dicing semiconductor substrate as required refers to a semiconductor element for further distinction. That is, in a broad sense, a semiconductor element and a semiconductor product obtained by incorporating the semiconductor element belong to the semiconductor substrate product.

2. Cobalt Removal Composition

A cobalt removal composition of the present invention contains orthoperiodic acid and water. Hereinafter, each component including other components will be described.

The cobalt removal composition of the present invention is sold, stored, transported and the like in a condensed state and may be diluted in use. Such an embodiment is also included in the cobalt removal composition of the present invention. In the following description, the preferable content and pH of each component in the cobalt removal composition mean the preferable content and pH of each component in use and an embodiment in which the composition is used by being diluted in use so that the content and pH of each component are within the following ranges even in the case in which the composition is sold, stored, transported and the like in a condensed state is included.

<Orthoperiodic Acid>

The cobalt removal composition of the present invention includes orthoperiodic acid.

The content of orthoperiodic acid in the cobalt removal composition is preferably 0.01% to 5% by mass with respect to the total amount of the composition. The content is more preferably 0.05% by mass or more, even more preferably 0.1% by mass or more, and particularly preferably 0.3% by mass or more. Further, the content is more preferably 4% by mass or less and even more preferably 3% by mass or less.

When the content of orthoperiodic acid is within the above range, Co removability is excellent and the ferromagnetic bodies and the insulating layer constituting the substrate are prevented from being damaged.

<Water>

The cobalt removal composition of the present invention contains water. As water, water which is subjected to a purification treatment, such as distilled water and ion exchange water or ultrapure water, is preferable and ultrapure water to be used for producing a semiconductor is particularly preferably used.

Water may contain a small amount of unavoidable mixing components within a range not impairing the effects of the present invention.

Although the content of water is not particularly limited, the content is preferably 30% by mass or more, more preferably 50% by mass or more, even more preferably 70% by mass or more, and particularly preferably 90% by mass or more with respect to the total amount of the composition. The upper limit is not particularly limited and is preferably the total amount excluding the aforementioned orthoperiodic acid and a pH adjusting agent, as a preferable additive, which will be described later.

When the content of water is 30% by mass or more, Co removability is excellent and damage to the substrate is suppressed. Thus, this case is preferable.

<Other Solvents>

The Co removal composition of the present invention may contain a water-soluble organic solvent in addition to water.

As the water-soluble organic solvent, the aforementioned water-soluble organic solvents in the MRAM dry etching residue removal composition are exemplified and the preferable range is also the same.

<pH Adjusting Agent>

It is preferable that the Co removal composition of the present invention contain a pH adjusting agent. Needless to say, the pH adjusting agent is a component other than the aforementioned orthoperiodic acid and water.

Preferable examples of the pH adjusting agent include an organic amine compound and a quaternary ammonium hydroxide and a quaternary ammonium hydroxide is more preferable.

As the organic amine compound and the quaternary ammonium hydroxide, the aforementioned organic amine compounds and quaternary ammonium hydroxides in the MRAM dry etching residue removal composition are exemplified and preferable ranges are also the same.

In addition, the content of the pH adjusting agent is that same as the preferable content of the pH adjusting agent in the MRAM dry etching residue removal composition and the ratio between the content of orthoperiodic acid and the content of the pH adjusting agent is the same as the preferable ratio between the strong oxidizing agent and the content of the pH adjusting agent in the MRAM dry etching residue removal composition.

<Other Components>

The Co removal composition of the present invention may further contain arbitrary components. As other components, other components in the MRAM dry etching residue removal composition are exemplified and the preferable ranges are also the same.

<pH>

In the present invention, it is preferable that the pH of the Co removal composition is in an alkali region. Specifically, the pH is preferably 9 or more and 14 or less and more preferably 10 or more and 13 or less.

When the pH is within the above range, Co removability is excellent and the surface of the film is prevented from being modified. Thus, this case is preferable.

[pH Measurement Method]

The pH is a value measured at room temperature (25° C.) using F-51 (trade name) manufactured by Horiba, Ltd.

(Conditions for Co Removal)

The Co removal treatment according to the present invention may be performed using a batch type device or may be performed using a sheet type device. The treatment temperature is preferably 10° C. or higher, more preferably 15° C. or higher, and even more preferably 20° C. or higher. The upper limit is preferably 50° C. or lower, more preferably 40° C. or lower, and even more preferably 30° C. or lower. Setting the treatment temperature to the above lower limit or more makes it possible to secure a sufficient removing rate with respect to the residues and thus is preferable. Setting the treatment temperature to the above upper limit or less makes it possible to maintain temporal stability in treatment rate and thus is preferable. Further, energy consumption is reduced.

It is preferable that the Co removal composition of the present invention has a high dissolution rate (etching rate) with respect to cobalt.

The dissolution rate with respect to Co is preferably 0.08 nm (0.8 Å)/min or greater, more preferably 0.5 nm (5 Å)/min or greater, and even more preferably 1 nm (10 Å)/min or greater. In addition, the upper limit is not particularly limited and is preferably 200 nm (2,000 Å)/min or less from the viewpoint that damage to the substrate is suppressed.

It is preferable that a metal layer to be protected has a low dissolution rate (etching rate). For example, the etching rate of the ferromagnetic layer or the insulating layer (specifically, CoFe, CoFeB, MgO, $Al_2O_3$, and the like) in MRAM is preferably 1 nm (10 Å)/min or less, more preferably 0.5 nm (5 Å)/min or less, and particularly preferably 0.1 nm (1 Å)/min or less. The lower limit is 0 nm/min and the lower the rate is, the more preferable it is.

Here, the dissolution rate is measured by the following method. Specifically, on a commercially available silicon wafer, substrates on which target layers (for example, a CoFeB layer and a MgO layer) are formed are respectively prepared. Regarding the thickness of each layer, the thickness of the metal layer to be protected, for example, a CoFeB layer or a MgO layer, is set to 50 nm (500 Å) and the thickness of the Co layer, which is a metal layer to be removed, is 200 nm (2,000 Å). The substrate is put into a container filled with the removal composition and is stirred at 250 rpm. The treatment temperature is set to 25° C. and the treatment time is set to 10 minutes. The test substrate after treatment is taken out and subjected to rinsing with isopropanol and the film thicknesses before and after the etching treatment are measured using ellipsometry (Vase, spectroscopic ellipsometer, manufactured by J. A. Woollam, Japan) to calculate the dissolution rate. The average value at five points is adopted (measurement conditions: measurement range: 1.2 to 2.5 eV, measuring angles: 70 degrees and 75 degrees).

Only the film thickness of the Co layer is measured using a resistivity measuring instrument VR-120S manufactured by Hitachi Kokusai Yagi Solutions Inc., by a DC four-probe method using a four point probe.

Particularly, in the present invention, in the case in which the dissolution rate of the cobalt alloy, which is used for forming a ferromagnetic layer and is typified by CoFeB, of the cobalt removal composition is 0 nm/min, or the dissolution rate of the cobalt alloy is greater than 0 nm/min, the ratio between the etching rate of Co and the dissolution rate of the cobalt alloy, which is used for forming the ferromagnetic layer and is typified by CoFeB, (Co dissolution rate/CoFeB dissolution rate) is preferably 2 or more, more preferably 5 or more, even more preferably 10 or more, particularly preferably 30 or more, and most preferably 50 or more. The upper limit is infinite without particular limitation and is preferably $10^{10}$ or less.

It is preferable that the dissolution rate of MgO of the cobalt removal composition of the present invention is low. Specifically, the dissolution rate is preferably 2 nm (20 Å)/min or less, more preferably 1 nm (10 Å)/min or less, even more preferably 0.5 nm (5 Å)/min or less, and particularly preferably 0.1 nm (1 Å)/min or less. The lower limit is 0 nm/min.

In the case in which the dissolution rate of MgO of the cobalt removal composition of the present invention is 0 nm/min or the dissolution rate of MgO is greater than 0 nm/min, the ratio between the etching rate of Co and the dissolution rate of MgO (Co dissolution rate/MgO dissolution rate) is preferably 2 or more, more preferably 5 or more, even more preferably 10 or more, and particularly preferably 20 or more. The upper limit is infinite without particular limitation and is preferably $10^{10}$ or less.

The exposure width of the metal layer (thickness of each layer) is not particularly limited and is preferably 1 nm or more and more preferably 2 nm or more from the viewpoint that the advantages of the present invention become remarkable. The upper limit is substantially 200 nm or less, preferably 100 nm or less, and more preferably 50 nm or less from the viewpoint that the effects thereof become significant in the same manner.

The cobalt removal composition of the present invention is suitably used for producing a magnetoresistive random access memory and particularly suitably used for removing dry etching residues for a magnetoresistive random access memory using a Co-containing metal layer as a ferromagnetic layer. The method of producing a magnetoresistive random access memory is the same as the method of producing a magnetoresistive random access memory using the MRAM dry etching residue removal composition and the preferable range is also the same.

EXAMPLES

Hereinafter, the present invention will be specifically described with reference to examples, but the present invention is not limited to examples described below. % and part(s) for showing formulations and the formulated amounts in examples are based on mass unless otherwise specified.

(Preparation of Test Substrates)

Each layer was formed on a commercially available silicon substrate (diameter: 12 inches) by a molecular beam epitaxy method (MBE) or chemical vapor deposition (CVD) so as to have the structure of FIG. 1(a). The thickness of each layer was 50 nm (500 Å). A predetermined portion patterned using a hard mask was subjected to a dry etching treatment under general conditions and processed to have the structure of FIG. 1(b).

(Preparation of Residue Removal Composition)

Residue removal compositions (removal compositions) to be applied to each test were prepared with formulations shown in Table 1 below. Each of the obtained removal compositions was used to conduct each residue removal test.

(Residue Removal Test)

The test substrate was put into a container filled with the removal composition and was stirred at 250 rpm. The treatment temperature was set to 25° C. and the treatment time was set to 10 minutes. The test substrate after treatment was taken out and subjected to rinsing with isopropanol.

(Etching Rate [ER])

For the etching rate (ER), a substrate from which each layer was exposed in Table 1 was used instead of using the substrate patterned with a hard mask. Specifically, a substrate on which a CoFeB layer was formed and a substrate on which a MgO layer was formed were respectively prepared on a commercially available silicon wafer. The thickness of each layer was set to 50 nm (500 Å). In addition, a substrate on which a Co layer was formed was prepared and the thickness of the Co layer was set to 200 nm (2,000 Å). The substrate was put into the container filled with the removal composition in the same manner as described above and was stirred. The conditions for stirring and temperature and the like were the same as those of the aforementioned residue removal test.

The film thicknesses of the CoFeB layer and the MgO layer were calculated by measuring the film thicknesses before and after the etching treatment using ellipsometry (Vase, spectroscopic ellipsometer, manufactured by J. A. Woollam, Japan). The average value at five points was adopted (measurement conditions: measurement range: 1.2 to 2.5 eV, measuring angles: 70 degrees and 75 degrees).

In addition, the film thicknesses of the Co layer before and after the etching treatment were measured using a resistivity measuring instrument VR-120S manufactured by Hitachi Kokusai Yagi Solutions Inc., by a DC four-probe method using a four point probe.

TABLE 1

| | | Composition | | | | | | | Etching rate (nm/min) | | |
|---|---|---|---|---|---|---|---|---|---|---|---|
| | | Strong oxidizing agent | % by mass | pH adjusting agent | % by mass | Remainder | % by mass | pH | Co | CoFeB | MgO |
| Example | 1 | Orthoperiodic acid | 1 | Tetramethylammonium hydroxide | 0.83 | Pure water | 98.17 | 11 | 1.330 | 0 | 0.179 |
| | 2 | Orthoperiodic acid | 1 | Tetraethylammonium hydroxide | 1.32 | | 97.68 | 11 | 1.703 | 0 | 0.143 |
| | 3 | Orthoperiodic acid | 1 | Monoethanolamine | 8.35 | | 90.65 | 11 | 5.610 | 0.068 | 0.360 |
| | 4 | Sodium persulfate | 1.04 | Tetramethylammonium hydroxide | 0.01 | | 98.95 | 11 | 18.790 | 0 | 0.605 |
| | 5 | Hydroxylamine | 0.15 | Tetramethylammonium hydroxide | 0.015 | | 99.835 | 11 | 0.097 | 0.001 | 0.946 |
| | 6 | Orthoperiodic acid | 1 | Tetramethylammonium hydroxide | 2.99 | | 96.01 | 13 | 0.600 | 0 | 0.000 |
| | 7 | Nitric acid | 0.27 | Tetramethylammonium hydroxide | 0.41 | | 99.32 | 11 | 0.124 | 0 | 0.558 |
| | 8 | Hydrochloric acid | 0.16 | Tetramethylammonium hydroxide | 0.44 | | 99.40 | 11 | 0.127 | 0 | 0.545 |
| | 9 | Sodium chlorate | 0.46 | Tetramethylammonium hydroxide | 0.007 | | 99.533 | 11 | 0.123 | 0 | 0.539 |
| | 10 | Bromic acid | 0.35 | Tetramethylammonium hydroxide | 0.4 | | 99.25 | 11 | 0.187 | 0 | 0.755 |
| | 11 | Sodium bromate | 0.66 | Tetramethylammonium hydroxide | 0.01 | | 99.33 | 11 | 2.344 | 0 | 0.512 |
| | 12 | Orthoperiodic acid | 1 | Tetramethylammonium hydroxide | 0.815 | | 98.185 | 3 | 18.707 | 1.065 | 2.300 |
| | 13 | Cerium ammonium nitrate | 2.4 | — | — | | 97.6 | 3 | 0.170 | 0.067 | 2.308 |

TABLE 1-continued

| | | Composition | | | | | | | Etching rate (nm/min) | | |
|---|---|---|---|---|---|---|---|---|---|---|---|
| | Strong oxidizing agent | % by mass | pH adjusting agent | % by mass | Remainder | % by mass | pH | Co | CoFeB | MgO |
| Comparative Example | 14 — | — | Methanesulfonic acid | 0.01 | Pure water | 99.99 | 3 | 1.835 | 1.065 | 2.000 |
| | 15 — | — | Tetramethylammonium hydroxide | 0.008 | | 99.992 | 7 | 0.026 | 0.063 | 2.200 |
| | 16 — | — | Tetramethylammonium hydroxide | 0.02 | | 99.98 | 9 | 0.032 | 0.005 | 1.900 |

EXPLANATION OF REFERENCES

1: Hard mask
2: Free layer
3: Second ferromagnetic layer (CoFeB or CoFe)
4: Insulator layer (MgO or $Al_2O_3$)
5: First ferromagnetic layer (CoFeB or CoFe)
6: Base electrode
7: Residue
H: Hole
d: Damaged portion

What is claimed is:

1. A method of producing a magnetoresistive random access memory comprising:
    a step of dry etching a semiconductor substrate including a ferromagnetic layer containing CoFeB and/or CoFe and an insulator layer containing MgO; and
    a step of removing dry etching residues with an MRAM dry etching residue removal composition,
    wherein the MRAM dry etching residue removal composition comprises a strong oxidizing agent and water, the strong oxidizing agent being orthoperiodic acid ($H_5IO_6$).

2. The method of producing a magnetoresistive random access memory according to claim 1,
    wherein the dissolution rate of Co of the MRAM dry etching residue removal composition is 0.2 nm/min or greater.

3. The method of producing a magnetoresistive random access memory according to claim 1,
    wherein in a case in which the dissolution rate of CoFeB of the MRAM dry etching residue removal composition is 0 nm/min or the dissolution rate of CoFeB of the MRAM dry etching residue removal composition is greater than 0 nm/min, a value of Co dissolution rate/CoFeB dissolution rate is 10 or greater.

4. The method of producing a magnetoresistive random access memory according to claim 1,
    wherein the dissolution rate of MgO of the MRAM dry etching residue removal composition is 1 nm/min or less.

5. The method of producing a magnetoresistive random access memory according to claim 1,
    wherein the content of the strong oxidizing agent of the MRAM dry etching residue removal composition is 0.01% to 5% by mass with respect to the total amount of the composition.

6. The method of producing a magnetoresistive random access memory according to claim 1,
    wherein the pH of the MRAM dry etching residue removal composition is 9 or more.

7. The method of producing a magnetoresistive random access memory according to claim 1, wherein the MRAM dry etching residue removal composition further comprises a pH adjusting agent.

8. The method of producing a magnetoresistive random access memory according to claim 7,
    wherein the pH adjusting agent is selected from the group consisting of an organic amine compound and a quaternary ammonium hydroxide.

9. The method of producing a magnetoresistive random access memory according to claim 7,
    wherein the content of the pH adjusting agent of the MRAM dry etching residue removal composition is 0.01% to 5% by mass with respect to the total amount of the composition.

10. The method of producing a magnetoresistive random access memory according to claim 1,
    wherein the content of water of the MRAM dry etching residue removal composition is 30% by mass or more with respect to the total amount of the composition.

* * * * *